United States Patent [19]
Yassine

[11] Patent Number: 5,835,997
[45] Date of Patent: Nov. 10, 1998

[54] WAFER SHIELDING CHAMBER FOR PROBE STATION

[75] Inventor: Abdullah M. Yassine, Tampa, Fla.

[73] Assignee: University of South Florida, Tampa, Fla.

[21] Appl. No.: 411,523

[22] Filed: Mar. 28, 1995

[51] Int. Cl.$^6$ .................................................. G01R 31/02
[52] U.S. Cl. ......................................... 324/754; 324/755
[58] Field of Search ................................ 324/754, 158.1, 324/760, 761, 762, 73.1, 765; 437/8; 439/482; 269/21; 438/14, 17

[56] References Cited

U.S. PATENT DOCUMENTS

| | | | |
|---|---|---|---|
| 3,710,251 | 1/1973 | Hagge et al. | 324/158 |
| 4,115,736 | 9/1978 | Tracy | 324/158 |
| 4,757,255 | 7/1988 | Margozzi | 324/760 |
| 4,787,752 | 11/1988 | Fraser et al. | 324/760 |
| 5,077,523 | 12/1991 | Blanz | 324/158 |
| 5,237,267 | 8/1993 | Harwood et al. | 324/158 |
| 5,266,889 | 11/1993 | Harwood et al. | 324/158 |
| 5,434,512 | 7/1995 | Schwindt et al. | 324/754 |

OTHER PUBLICATIONS

"Electrical Noise and VLSI Interconnect Reliability", IEEE Transactions on Electron Devices, vol. 41, No. 11, Nov. 1994, pp. 2165–2172, by Tsong–Ming Chen and Abdullah M. Yassine.

*Primary Examiner*—Vinh P. Nguyen
*Attorney, Agent, or Firm*—Stein, Schifino & Van Der Wall

[57] ABSTRACT

A wafer shielding chamber assembly for a semiconductor wafer probe station that minimizes the volume of space about the semiconductor wafer so as to minimize air currents about the wafer. The chamber is formed by positioning an annular spacer ring onto the annular periphery of the wafer chuck. A lid is positioned to free-float underneath the support ring of the probe station. The free-floating of the lid permits the upper surface of the spacer ring to engage the lower surface of the lid as the wafer chuck is moved in the z direction and, upon further z movement, moves the lid into the z direction, while still permitting x & y movement between the two. A center hole is formed through the lid. The center hole provides access for the micropositioners contact probes to the wafer. A cylindrical cap assembly is positioned on top of the lid concentric with the center hole. Openings are formed in the cap assembly, each providing access for a micropositioners probe arm to extend therethrough and for the contact probes thereof to extend through the center hole to the wafer. An optical lens allows visual access to the center hole thereby facilitating alignment of the contact probes with the contact pads of the wafer positioned on the chuck.

25 Claims, 5 Drawing Sheets

WAFER SHIELDING CHAMBER FOR PROBE STATION

BACKGROUND OF THE INVENTION

1. Field of the Invention

This invention relates to probe stations design for measuring electrical characteristics of integrated circuits and other semiconductors at the wafer or the packaged levels. More particularly, this invention relates to probe stations that enclose the integrated circuit wafer or package to eliminate air currents so that more accurate noise measurements may be taken for reliability testing.

2. Description of the Background Art

Presently, it is known that noise measurements of wafer- and package-level integrated circuits can be utilized for reliability testing. However, special considerations must be taken to assure that extraneous noise introduced during the noise measurements is minimized. As set forth in "Electrical Noise and VLSI Interconnect Reliability" published in *IEEE Transactions on Electron Devices*, Vol. 41, No. 11, Nov. 1994, pp. 2165–2174, by the inventors of this invention, the disclosure of which is hereby incorporated by reference herein, it is known that the configuration and composition of the contact probes, as well as the mechanical connections of them to the circuit, should be designed to be low-noise. With regard to the former, it is known that beryllium-copper probes with a semi-spherical tip minimize probe contact resistances. As to the latter, it is known that the probe station should be mounted on a vibration absorption table so that noise introduced because of mechanical vibrations is minimized. More recently, it was discovered by the inventors hereof, that when the wafer is subjected to a high direct current (DC) current that raises the wafer's temperature above ambient, the magnitude of the noise voltage spectrum dramatically increased at frequencies below three hertz. It was suspected that the increase in the noise level at low frequencies was due to the presence of electromagnetic fields and/or air currents around the wafer.

Presently, there exist several types of probe stations. Representative probe stations are disclosed in U.S. Pat. No. 3,710,251 issued to Hagge et al, U.S. Pat. No. 4,115,736 issued to Tracy, U.S. Pat. No. 5,077,523 issued to Blanz and U.S. Pat. Nos. 5,237,267 & 5,266,889 issued to Harwood et al., the disclosures of each of which are hereby incorporated by reference herein.

The probe station disclosed in the patent to Hagge et al includes a micro electric wafer or chip vacuum chuck in the form of a heat exchanger pedestal. An enlarged, upper transparent inverted nitrogen shroud cup is positioned over the pedestal chuck and is seated onto the cylindrical electronics package that encircles the pedestal chuck. A smaller, lower nitrogen chamber is positioned about the pedestal chuck. During use, nitrogen is pumped into the nitrogen shroud cup and into the nitrogen chamber. The nitrogen in the shroud cup flows downwardly to encompass the upper area of the pedestal chuck. Simultaneously, nitrogen escapes from the nitrogen chamber about the peripheral edge of the top surface of the pedestal chuck. As a result, the wafer or chip placed on the top surface is constantly bathed in nitrogen. The wafer or chip is therefore protected from oxidation damage at high temperature or frost damage at low temperatures. Unfortunately, however, no consideration is given in the Hagge patent to the minimization of noise during measurements.

In the Tracy patent, a probe station is disclosed for testing semiconductors in accordance with military specifications by testing them when subjected to very low temperatures and pressures. The probe station includes a cryogenic container having a top platform pedestal on which the semiconductor device is to be seated. A vacuum chamber is positioned above the platform pedestal. The micropositioning probes extend into the vacuum chamber by means of bellows that allow the probes to be adjusted as necessary for testing. The vacuum chamber is evacuated. The cryogenic container is filled with liquid nitrogen to cryogenically cool the semiconductor device. The semiconductor may thus be tested under the same pressure and temperature at which they are designed to operate. Unfortunately, however, while the evacuated vacuum chamber is positioned about the semiconductor device, the added complexity and associated costs of the probe station is unwarranted when testing conventional semiconductor devices. Further, the use of a vacuum chamber severely compromises testing on a production scale.

In the Blanz patent, there is disclosed another cryogenic probe station having a cryogenically cooled platform pedestal on which the semiconductor device is seated. A probe card with downwardly extending measuring electrodes, is positioned above the pedestal for making electrical contact with the semiconductor device as the pedestal is appropriately moved in x-y-z directions. Unfortunately, no consideration is given to the effects of air currents about the area of the semiconductor device and the measuring electrodes.

In the Harwood et al. patents, particularly U.S. Pat. No. 5,266,889, there is disclosed a probe station with an integrated environment control enclosure for EMI shielding, for substantially hermetic sealing for a dry purge gas for low-temperature testing, and for creating a dark environment. The enclosure comprises an upper box portion rigidly connected to a movable platen and a lower box portion rigidly connected to the probe station base. The top of the upper box portion comprises an octagonal box having eight side panels. The extending arms of the eight probe micropositioners extend through openings in the side panels. Resilient foam having a slit formed therein is placed in each of the openings for forming a seal with the extending arms. The slits allow for x-y-z movement of the extending arms to appropriately contact the semiconductor wafer positioned on the movable platen. A door is provided in the upper box portion for loading and unloading of the semiconductor wafer onto the platen. During testing, the enclosure may be filled with dry purge gas to prevent condensation of moisture onto the wafer at low test temperatures. Unfortunately, however, the enclosure is of such a volume that it is evident that no consideration was given to the effects of air currents within the enclosure.

Therefore, it is an object of this invention to provide improvements to overcome the aforementioned inadequacies of the prior art probe stations and provide an improvement which is a significant contribution to the advancement of the probe station art.

Another object of this invention is to provide a wafer shielding chamber for a probe station, the probe station including a ring carrier for supporting at least one micropositioner having a probe arm and probe and including a carriage for supporting a wafer chuck to be probed by the contact probe of the micropositioner, comprising in combination an annular ring positioned about the wafer chuck and a lid with a center hole positioned between said annular ring and the ring carrier, whereby, a chamber is formed within said annular ring when moved into engagement with said lid thereby substantially precluding air currents within said chamber.

Another object of this invention is to provide a wafer shielding chamber as noted above, wherein said connecting means includes means for constantly urging said lid into engagement with said annular ring.

Another object of this invention is to provide a wafer shielding chamber as set forth above, and further including a cap assembly for positioning about said center hole of said lid.

Another object of this invention is to provide a wafer shielding chamber as set forth above, wherein said upper annular member further includes an inner annular member having a notched opening permitting the contact probe of the micropositioner to extend therethrough.

Another object of this invention is to provide a method for reducing air current about a wafer in a probe station, comprising the step of positioning an annular ring about the wafer chuck, positioning a lid with a center hole near the annular ring, and moving the annular ring and the lid together whereby a chamber is formed within the annular ring when moved into engagement with the lid thereby substantially precluding air currents within the chamber.

Another object of this invention is to provide a method as set forth above, further including the step of operatively connecting the lid to a ring carrier to allow movement of the lid when the annular ring is moved into engagement therewith.

Another object of this invention is to provide a method as set forth above, further including the step of positioning a cap assembly about the center hole of the lid.

Another object of this invention is to provide a method as set forth above, wherein the cap assembly comprises an upper annular member and a lower annular member with one of the upper annular member and the lower annular member including an opening through which may pass the probe arm of the micropositioner.

These objects should be construed to be merely illustrative of some of the more prominent features and applications of the intended invention. Many other beneficial results can be obtained by applying the disclosed invention in a different manner or modifying the invention within the scope of the disclosure. Accordingly, other objects and a more comprehensive understanding of the invention may be obtained by referring to the summary of the invention, and the detailed description of the preferred embodiment in addition to the scope of the invention defined by the claims taken in conjunction with the accompanying drawings.

SUMMARY OF THE INVENTION

For the purpose of summarizing this invention, this invention comprises a wafer shielding chamber assembly for a probe station that is of such configuration and size that air currents in the chamber are minimized.

More particularly, during testing in a conventional probe station, it was realized that when a high current is passed through a semiconductor device such as on a wafer or chip, the magnitude of the noise voltage spectrum was observed to increase drastically at low frequencies. Further, it was observed that the magnitude of the noise voltage spectrum increased as the temperature increased considerably above room temperature. Upon further experimentation to eliminate possible electromagnetic noise, it was determined that the principal cause for the increase in the magnitude of the noise voltage spectrum was the existence or creation of air currents about the semiconductor device. Indeed, it was discovered that as the volume of space about the semiconductor device decreased, the magnitude of the noise voltage spectrum likewise decreased.

The wafer shielding chamber of the invention minimizes the volume of space about the semiconductor wafer so as to minimize (or reduce altogether) air currents about the wafer. The chamber is formed by positioning (as by adhering) a annular spacer ring onto the annular periphery of the wafer chuck. A flat metal plate, serving as a lid, is positioned to free-float underneath the support ring of the probe station. The free-floating of the lid permits the upper surface of the spacer ring to engage the lower surface of the lid as the wafer chuck is moved in the z direction and, upon further z movement, moves the lid into the z direction, while still permitting x & y movement between the two. It is noted that the upper surface of the spacer ring and/or the lower surface of the lid, are preferably coated with an anti-friction material such a Teflon, to facilitate x & y movement between the spacer ring and the lid. Adequate sliding engagement between the upper surface of the spacer ring and the lower surface of the lid is therefore assured.

A center hole is formed through the lid. The center hole provides access for the micropositioners contact probes to the wafer.

A cylindrical cap assembly is positioned on top of the lid concentric with the center hole. One or more openings are formed in the cap assembly, each providing access for a micropositioners probe arm to extend therethrough and for the contact probes thereof to extend through the center hole to the wafer. The openings are large enough to allow micrometer x-y-z adjustment of the probe arms but small enough to preclude substantial air currents to flow therethrough. The cap assembly may include an internal baffle, with appropriately aligned openings, to further reduce air currents therethrough. An optical lens or other transparent member is positioned in the top of the cap assembly for allowing visual access to the center hole thereby facilitating alignment of the contact probes with the contact pads of the semiconductor wafer positioned on the chuck. The cap assembly may be modified to allow the use of probe cards in lieu of the micropositioners.

The wafer shielding chamber assembly of the invention stabilizes the wafer temperature by blocking and reducing air flow from outside of the assembly to the wafer surface. Wafer-level noise signal testing of the wafer at elevated temperatures is now more feasible.

Importantly, the wafer shielding chamber assembly of the invention is simple and may be easily incorporated into existing and future experimental and production probe stations without significant added cost or complexity.

The foregoing has outlined rather broadly the more pertinent and important features of the present invention. The detailed description of the present invention that follows is offered so that the present contribution to the art may be more fully appreciated. Additional features of the invention will be described hereinafter. These form the subject of the claims of the invention. It should be appreciated by those skilled in the art that the conception and the disclosed specific embodiment may be readily utilized as a basis for modifying or designing other methods and structures for carrying out the same purposes of the present invention. It should also be realized by those skilled in the art that such equivalent methods and structures do not depart from the spirit and scope of the invention as set forth in the appended claims.

BRIEF DESCRIPTION OF THE DRAWINGS

For a fuller understanding of the nature and objects of the invention, reference should be had to the following detailed description taken in connection with the accompanying drawings in which.

Similarly referenced numerals refer to similar parts throughout the several figures.

DETAILED DESCRIPTION OF THE PREFERRED EMBODIMENT

Figure 1:
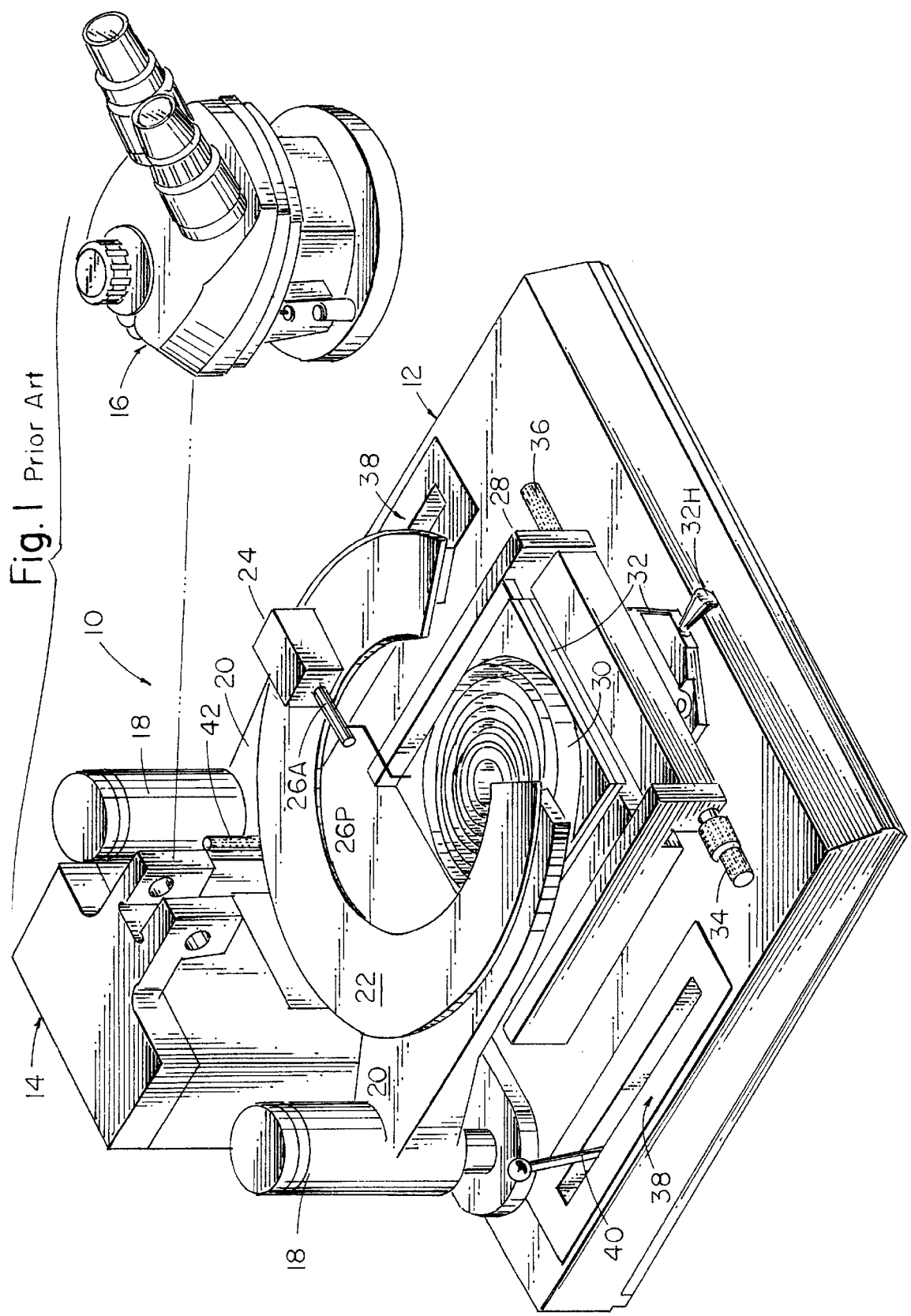
FIG. 1 is a perspective view of a prior art probe station, partially exploded, illustrating the positioning of a microscope above a ring carrier that carries at least one micropositioner so that its probe arm and probe extend to a hot chuck positioned therebelow.

As shown in FIG. 1, a conventional probe station 10 comprises a base 12 having a microscope post 14 extending vertically from the rearward portion of the base 12. The microscope post 14 is adapted to pivotally receive a variety of stereozoom or microzoom microscopes, generally indicated by numeral 16. A pair of ring carriers support posts 18 extend from opposing sides of the microscope post 14. The support posts 18 include outward extending brackets 20 to which is secured a ring carrier 22.

The ring carrier 22 is adapted such that one or more micropositioners 24 (for clarity, only one is illustrated) may be mounted thereon, with its probe arm 26A extending radially toward the center of the ring carrier 22 and with its contact probe 26P then extending downwardly from the arm 26A toward the base 12 of the probe station 10.

An x-y carriage 28 is operatively mounted to the base 12 underneath the ring carrier 22. A chuck, such as a hot chuck 30, is mounted to a slide member 32 of the x-y carriage assembly 28. The slide member 32 allows the hot chuck 30 to be moved from its retracted position substantially concentric with the ring carrier 22 to an extended position forwardly of base 12 for wafer loading and unloading thereon. X and Y micrometers 34 and 36 allow micrometer movement of the carriage assembly 28 relative to the ring carrier 22.

The probe station 10 further includes a z movement assembly 38 operatively connected to the carriage assembly 28 for vertically moving the carriage assembly 28 via levers 40. Further, the z movement assembly 38 includes a micrometer 42 for micrometer adjustment of the carriage assembly 28 in the z direction.

The probe station 10 as hereinabove described comprises a Rucker & Kolls Model 666 probe station. However, it shall be understood that the subject invention as described below may be incorporated into a large variety of makes and models of probe stations, whether they are manually or automatically operable.

Figure 2:
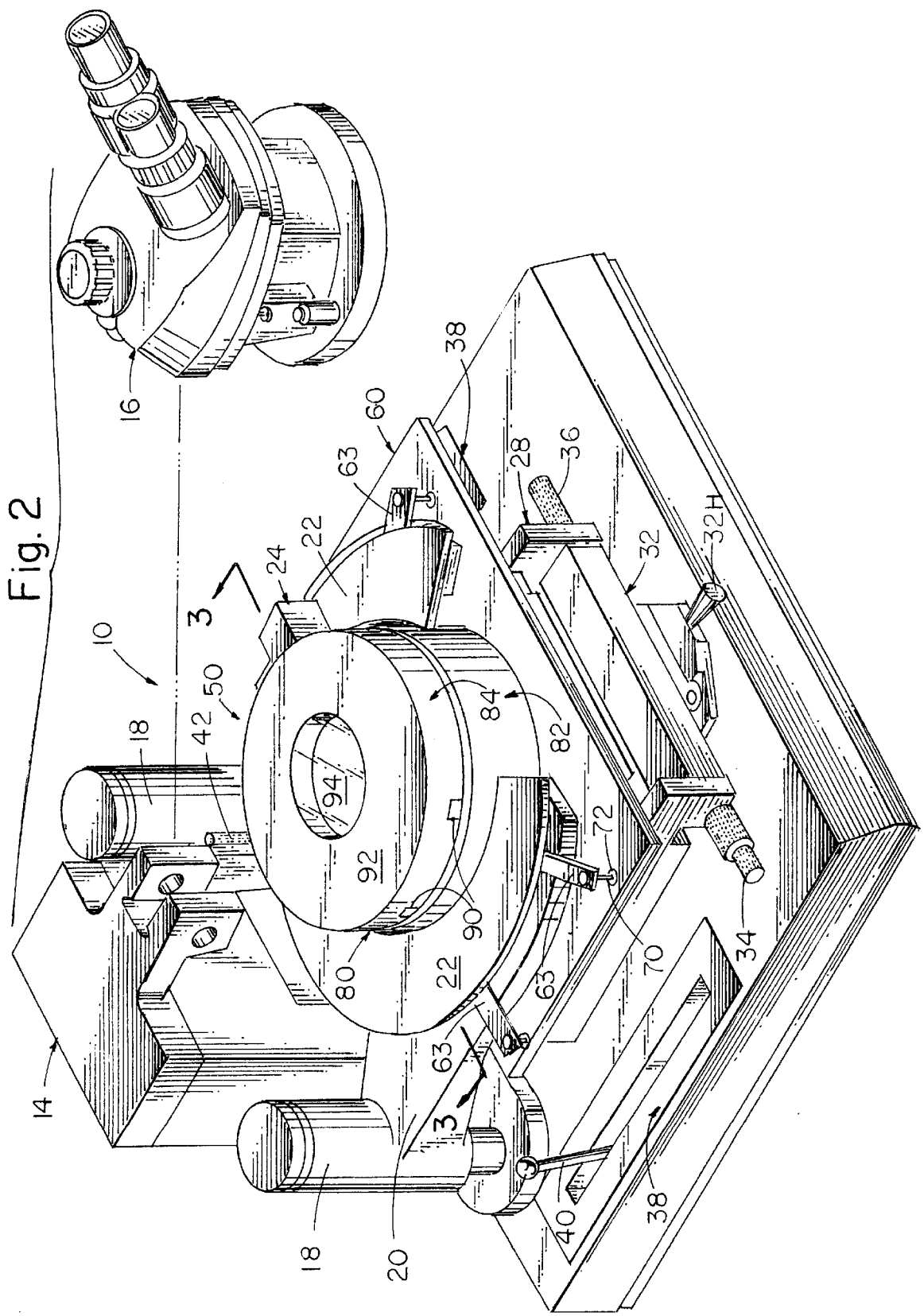
FIG. 2 is a perspective view of the prior art probe station of FIG. 1, with the wafer shielding chamber assembly of the invention incorporated therein for shielding a semiconductor wafer positioned on the upper surface of the hot chuck from air currents during noise measurement testing.

As shown broadly in FIG. 2, the invention comprises a wafer shielding chamber assembly, generally indicated by numeral 50, which is easily retrofitted to the conventional probe station 10 shown in FIG. 1 and described above. The wafer shielding assembly 50 of the invention serves to enclose the area about a wafer that is positioned on the hot chuck 30 so as to minimize any air currents while still permitting the contact probes 26P of the micropositioner probe arms 24A to contact the selected areas of the wafer (shown in phantom with numeral 58).

Figure 3:
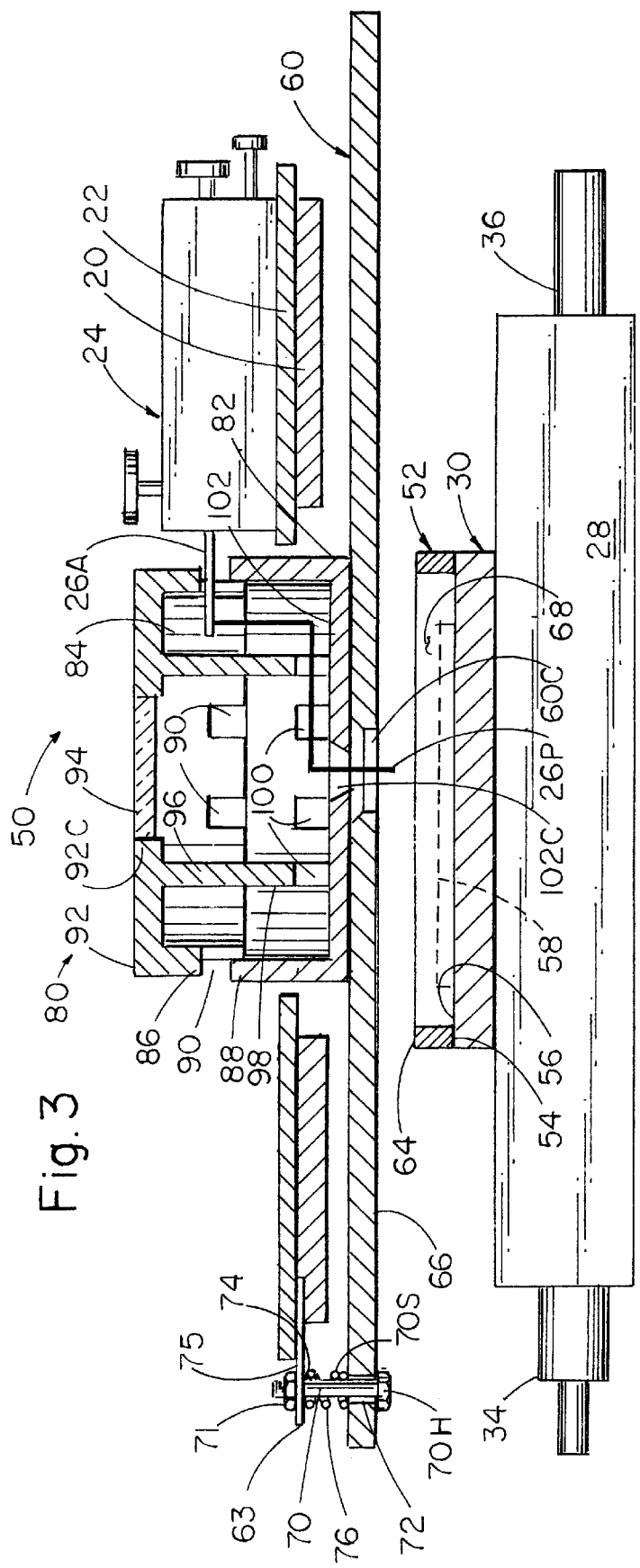
FIG. 3 is a cross-sectional view of FIG. 2 along lines 3—3 with the hot chuck in its retracted position.

More particularly, as better seen in FIG. 3, the wafer shielding chamber assembly 50 comprises a spacer ring 52 which is appropriately configured and dimensioned to be substantially the same as the annular periphery of the hot chuck 30. As shown, with a disk-shaped hot chuck 30, spacer ring 52 preferably comprises an annular configuration having a diameter substantially equal to the diameter of the hot chuck 30 so that the annular spacer ring 52 may be seated thereon (or to immediately encircle the hot chuck 30). In this regard, it is noted that the lower surface 54 of the annular spacer ring 52 includes a configuration for mating engagement with the upper surface 56 of the hot chuck 30. For example, as shown, if the upper surface 56 of the hot chuck 30 comprises a flat configuration, the lower surface 54 of the spacer ring 52 should likewise comprise a flat configuration for mating engagement therewith. The spacer ring 52 may be adhered to or otherwise affixed to the hot chuck 30.

The annular spacer ring 52 is preferably of a height that is appreciably greater than the thickness of typical semiconductor wafers or chips that are to be tested.

The wafer shielding assembly 50 of the invention further comprises a flat metal plate that serves as a lid 60 to the spacer ring 52. The lid 60 includes a center hole 60C allowing the contact probe 26P to extend therethrough toward the hot chuck 30. The center hole 60C preferably comprises a double taper configuration.

The lid 60 is connected relative to the underside 62 of the ring carrier 22 to be substantially parallel to the upper surface 64 of the spacer ring 52 (which is likewise substantially parallel to the upper surface 56 of the hot chuck 30) so that the upper surface 64 of the spacer ring 52 is positioned in contiguous engagement with the lower surface 66 of the lid 60 when the z movement assembly 38 moves the carriage assembly 28 upwardly. When the upper surface 64 of the spacer ring 52 is in contiguous engagement with the lower surface 66 of lid 60, a small volume chamber 68 is created. Chamber 68 is defined by the annular walls of the spacer ring 52, the upper surface 56 of the hot chuck 30 and the lower surface 66 of the lid 60.

Preferably, the lid 60 is operatively connected relative to the underside 62 of the ring carrier 22 in a free-floating manner to allow additional vertical movement thereof. In a preferred embodiment, the free-floating function of the lid 60 is accomplished by means of a bolt 70 (and nut 71) that slidably engages through a hole 72 in the outer periphery of the lid 60 and then slidably engages a corresponding hole 74 in extension brackets 75 extending from the supports post brackets 20. With a plurality of such brackets 75 and bolts 70 secured about the periphery of the lid 60 from the support post brackets 20, it should be readily apparent that the lid 60 is seated upon the heads 70H of the bolt 70 but may be moved upwardly along the shank 70S of the bolt 70 (or within hole 74) as the spacer ring 52 is moved into contiguous engagement therewith. Additional vertical movement (by operation of the z movement assembly 38 or the z micrometer 42) is permitted along the length of the shank 70S of the bolt 70 while maintaining the integrity of the chamber 68. A compression spring 76 may be positioned concentrically about each of the bolts 70 to assure an entire contiguous contact between the upper surface 64 of the spacer ring 52 and the lower surface of the lid 66. In this regard, it is noted that the upper surface 64 of the spacer ring 52 and/or the lower surface 66 of lid 60 may be coated with an anti-friction such as Teflon so as to enhance sliding movement therebetween.

Figure 4:
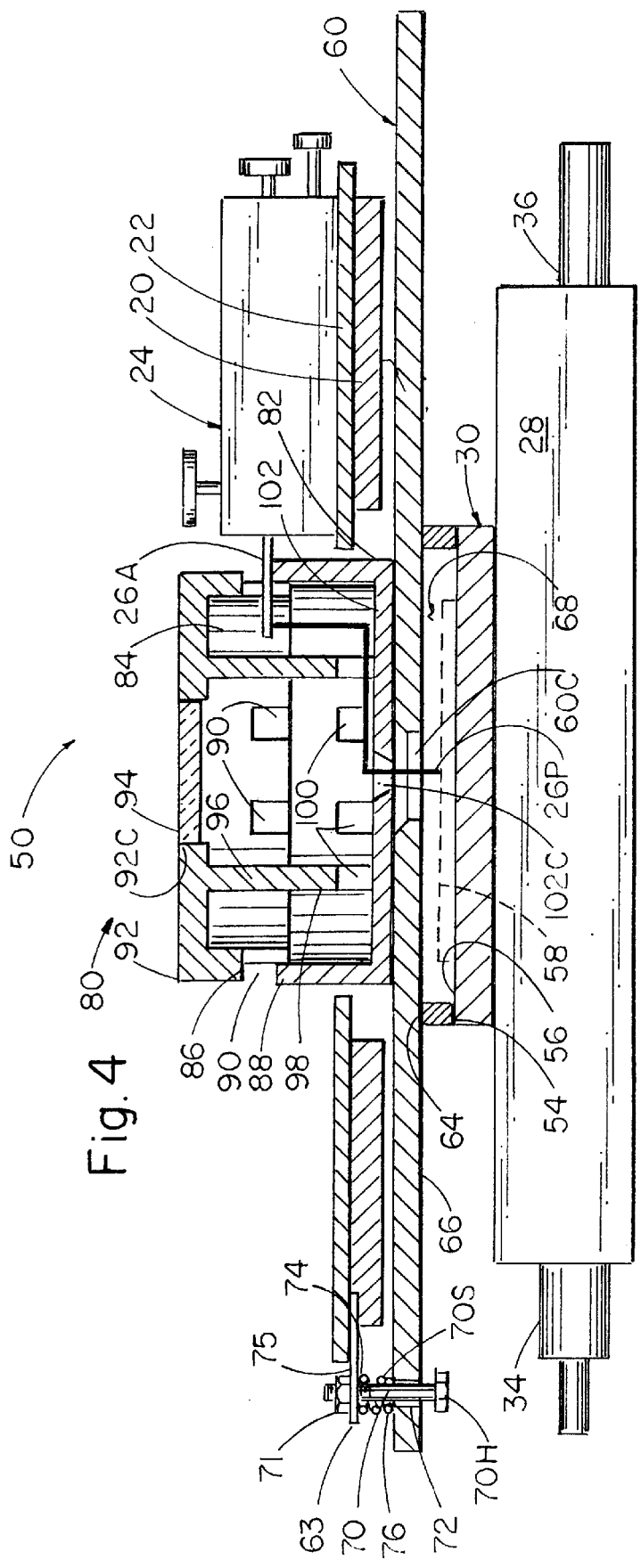
FIG. 4 is another cross-sectional view of FIG. 2 similar to FIG. 3, but with the hot chuck being fully extended in its z direction so as to form a chamber between a lid member secured to the underside of the ring carrier and an annular spacer ring positioned on the annular periphery of the hot chuck.
Figure 5:
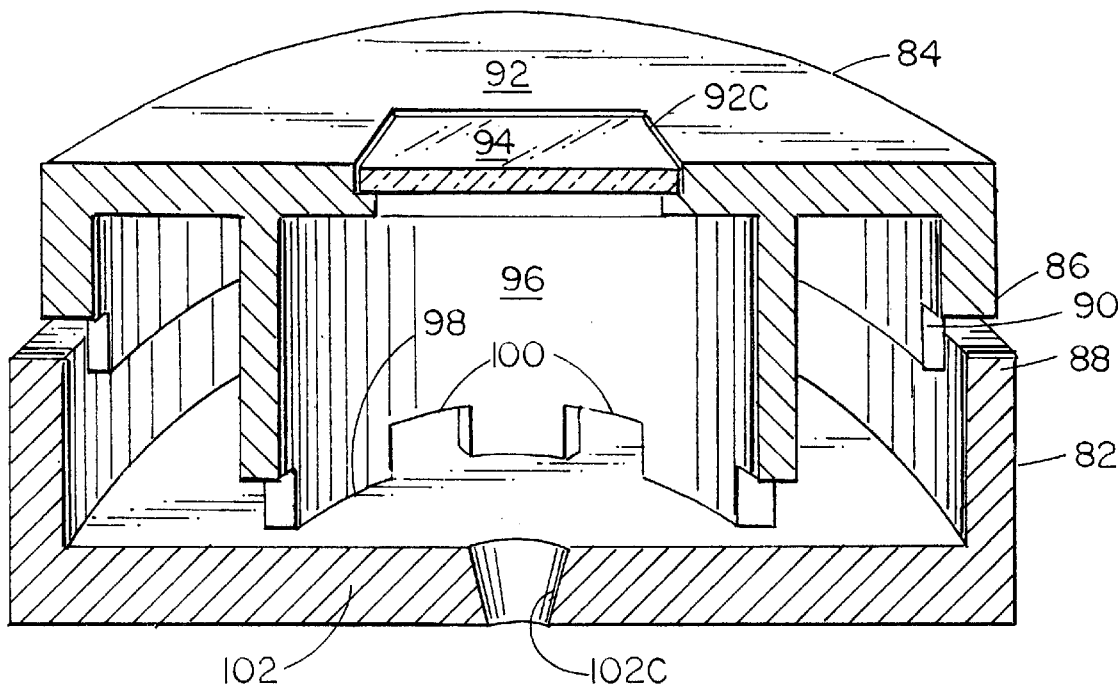
FIG. 5 is an enlarged cross-sectional view of the cylindrical cap assembly of the invention.

As shown in FIG. 2, the wafer shielding chamber assembly 50 further includes a cap assembly 80 that covers the center hole 60C of the lid 60. More particularly, as better shown in FIGS. 3, 4, and 5, cap assembly 80 comprises a lower annular member 82 and an upper annular member 84. The lowermost edge of the upper annular member 84 includes an annular step 86 that fits at least partially into the upper edge portion 88 of the lower annular member 82. The step 86 of the upper annular member 84 includes a plurality of notched openings 90 aligned with the intended locations of the probe arms 26A to allow free x, y and z adjustment thereof and to allow for free-floating upward adjustment of the lid 60. Notably, the dimensions of the notched openings 90 are selected to define openings that are on the one hand, minimized but on the other hand, are sufficiently large to permit the intended adjustments.

A horizontal member 92 is formed at the upper portion of the upper annular member 84. A center hole 92C is formed in the horizontal member 92. A transparent member such as glass 94 is positioned within the center hole 92C of the horizontal member 92 so as to permit viewing of the wafer 58 by the microscope 16.

The cap assembly 80 further includes an inner annular member 96 rigidly connected to the underside of the horizontal member 92 and positioned concentrically with its center hole 92C. The lower edge portion 98 of the inner annular member 96 comprises a plurality of notched openings 100 in radial alignment with the notched openings 90 of the annular step 86 of the upper annular member 84. The notched openings 100 of the lower edge portion 98 of the inner annular member 96 allows the contact probes 26P to extend therethrough and into the center hole 60C of the lid 60. Similar to notched openings 90, the notched openings 100 are dimensioned and configured to minimize the area of such openings while being of sufficient area to permit the intended adjustment of the contact probes 26P of the micropositioners 24 and to permit free-floating of the lid 60.

The lower annular member 82 includes a horizontal member 102 having a center hole 102C. The center hole 102C comprises a tapered configuration with a larger inner diameter and a small outer diameter. The center hole 102C is positioned so as to be concentric with the center hole 60C of the lid 60 when seated upon the upper surface of the lid 60. The upper edge portion 88 of the lower annular member 82 is dimensioned to a height to allow the probe arms 26A of the micropositioner contact probes 24 to extend thereover towards the center hole 60C of the lid 60.

It is noted that the lower edge portion 98 of the inner annular member 96 is seated upon the upper surface of the horizontal member 102. Therefore, it should be appreciated that the length of the inner annular member 96 relative to the depth of the notched openings 90 and relative to the vertical length of the annular members 82 and 84, determines the opened area of the notched openings 90 when the annular members 82 and 84 are mated. Most importantly, it should be appreciated that the inner annular member 96 with its notched openings 100 positioned lower than the notched openings 90 of the upper annular member 84, substantially precludes any air currents flowing therethrough that otherwise may occur due to "chimney" drafts.

A probe station 10 having the wafer shielding chamber assembly 50 of the invention incorporated therein, may be utilized as follows. Slide member 32 is extended via handle 32H from the base 12. A semiconductor wafer or chip 58 to be tested is placed onto the hot chuck 30. The slide member 32 is then pushed via handle 32H to its fully-retracted position underneath the center hole 60C of the lid 60. The upper annular member 84 together with the inner annular member 96 are then concentrically positioned within the lower annular member 82 with the respective notched openings 90 and 100 being aligned with the probe arms 26A and contact probes 26P, respectively. The microscope 16 may then be pivoted into position over the glass 94. The z movement assembly 38 may be operated via levers 40 to raise the x-y carriage assembly 28 causing the upper surface 64 of the spacer ring 52 to engage the lower surface 66 of the lid 60.

To obtain noise measurements, the micrometers 34, 36 and 42 may be operated to move the x-y carriage assembly 28 relative to the lid 60 to precisely make contact between the contact probes 26P and the desired areas of the wafer 58. The air currents about the wafer 58 are minimized or reduced altogether because of the wafer shielding chamber assembly 50 of the invention. More accurate noise measurements may therefore be obtained.

The present disclosure includes that contained in the appended claims as well as that of the foregoing description. Although this invention has been described in its preferred form with a certain degree of particularity, it should be understood that the present disclosure of the preferred form has been made only by way of example and that numerous changes in the details of construction and combination and arrangement of parts may be resorted to without departing from the spirit and scope of the invention.

Now that the invention has been described,

What is claimed is:

1. A wafer shielding chamber for a probe station, the probe station including a ring carrier for supporting at least one micropositioner having a probe arm and probe and including a carriage for supporting a wafer chuck in which is positioned a semiconductor device to be probed by the contact probe of the micropositioner, comprising in combination:

an annular ring positioned about the wafer chuck, said annular ring having a height that is appreciably greater than a thickness of the device positioned on the wafer chuck; and a lid with a center hole positioned between said annular ring and the ring carrier, whereby, a chamber is formed within said annular ring when the annular ring is moved into engagement with said lid and whereby the wafer chuck and the device are enclosed within said annular ring in the chamber thus formed, thereby substantially precluding air currents within said chamber.

2. The wafer shielding chamber of claim 1, further including means for operatively connecting said lid to the ring carrier to allow movement of said lid when said annular ring is moved into engagement therewith.

3. The wafer shielding chamber as set forth in claim 2, wherein said connecting means includes means for constantly urging said lid into engagement with said annular ring.

4. The wafer shielding chamber as set forth in claim 2, wherein said annular ring is positioned on a receiving surface of the wafer chuck.

5. The wafer shielding chamber as set forth in claim 3, wherein a surface of said annular ring in engagement with said lid comprises an anti-friction surface facilitating sliding engagement therewith.

6. The wafer shielding chamber as set forth in claim 1, wherein said center hole of said lid comprises a tapered configuration.

7. The wafer shielding chamber as set forth in claim 1, further including a cap assembly for positioning about said center hole of said lid.

8. The wafer shielding chamber as set forth in claim 7, wherein said cap assembly comprises an upper annular member and a lower annular member with one of said upper annular member and said lower annular member including an opening through which may pass the probe arm of the micropositioner.

9. The wafer shielding chamber as set forth in claim 8, wherein said upper annular member is removable from, and rotatable relative to, said lower annular member.

10. The wafer shielding chamber as set forth in claim 8, wherein said opening comprises a notched opening formed in said upper annular member.

11. The wafer shielding chamber as set forth in claim 10, wherein said upper annular member further includes an inner annular member.

12. The wafer shielding chamber as set forth in claim 11, wherein said inner annular member comprises a notched opening permitting the contact probe of the micropositioner to extend therethrough.

13. The wafer shielding chamber as set forth in claim 12, wherein said opening comprises a notched opening formed at a lowermost edge of said inner annular member.

14. The wafer shielding chamber as set forth in claim 8, wherein said upper annular member further includes a transparent member allowing viewing into said chamber formed by said upper annular member and said lower annular member.

15. The wafer shielding chamber as set forth in claim 14, wherein said transparent member is positioned within a horizontal member of said upper annular member.

16. The wafer shielding chamber as set forth in claim 10, wherein said lower annular member comprises a horizontal member having a center hole therethrough.

17. The wafer shielding chamber as set forth in claim 16, wherein said center hole of said horizontal member comprises a tapered configuration.

18. A method for reducing air current about a semiconductor device in a wafer chuck of a probe station, comprising the steps of:

positioning an annular ring about the wafer chuck;

positioning a lid with a center hole near the annular ring;

positioning a cap assembly about said center hole of said lid, the cap assembly including at least one visual access hole for allowing visualization of the device and at least one opening through which may pass a probe arm of a micropositioner for contact with the device via the center hole of the lid;

moving the annular ring and the lid together whereby a chamber is formed within the annular ring to enclose the device, the chamber being open to the atmosphere via the center hole of the lid and the opening of the cap assembly when the annular ring is moved into engagement with the lid thereby substantially precluding air currents within the chamber.

19. The method as set forth in claim 18, further including the step of operatively connecting the lid to a ring carrier to allow movement of the lid when the annular ring is moved into engagement therewith.

20. The method as set forth in claim 19, wherein the step of connecting includes the step of constantly urging the lid into engagement with the annular ring.

21. The method set forth in claim 20, further including the step of applying an anti-friction surface between the lid and the annular ring to facilitate sliding engagement therebetween.

22. The method as set forth in claim 18, wherein the cap assembly comprises an upper annular member and a lower annular member with one of the upper annular member and the lower annular member including an opening through which may pass the probe arm of the micropositioner.

23. The method as set forth in claim 22, wherein the upper annular member further includes an inner annular member.

24. The method as set forth in claim 23, wherein the inner annular member comprises a notched opening permitting the contact probe of the micropositioner to extend therethrough.

25. The method as set forth in claim 24, wherein the lower annular member comprises a horizontal member having a center hole therethrough through which the contact probe passes.

* * * * *